United States Patent
Yee

(10) Patent No.: US 9,002,031 B2
(45) Date of Patent: Apr. 7, 2015

(54) METHOD, SYSTEM AND APPARATUS FOR IMPROVING THE SONIC QUALITY OF AN AUDIO SIGNAL

(76) Inventor: Michael Yee, Mt. Shasta, CA (US)

( * ) Notice: Subject to any disclaimer, the term of this patent is extended or adjusted under 35 U.S.C. 154(b) by 376 days.

(21) Appl. No.: 13/429,347

(22) Filed: Mar. 24, 2012

(65) Prior Publication Data

US 2012/0257769 A1    Oct. 11, 2012

Related U.S. Application Data

(60) Provisional application No. 61/473,923, filed on Apr. 11, 2011.

(51) Int. Cl.
*H03G 5/00* (2006.01)
*H03G 7/00* (2006.01)
*H04B 15/00* (2006.01)

(52) U.S. Cl.
CPC .............. *H03G 7/007* (2013.01); *H03G 7/002* (2013.01)

(58) Field of Classification Search
CPC .... H04R 25/502; H04R 25/505; H04S 1/002; H03G 5/00
USPC ............ 381/98, 94.2, 2, 104, 23, 1, 106, 108, 381/14, 94.5; 704/226, 227; 348/484; 700/94
See application file for complete search history.

(56) References Cited

U.S. PATENT DOCUMENTS

| | | | |
|---|---|---|---|
| 4,933,675 A | 6/1990 | Beard | |
| 6,246,885 B1 | 6/2001 | Black et al. | |
| 6,587,011 B2 | 7/2003 | Mellot | |
| 2008/0049951 A1* | 2/2008 | Avendano et al. | 381/94.2 |
| 2008/0068512 A1* | 3/2008 | Sharma et al. | 348/724 |

* cited by examiner

*Primary Examiner* — Vivian Chin
*Assistant Examiner* — Ammar Hamid
(74) *Attorney, Agent, or Firm* — Haverstock & Owens LLP

(57) ABSTRACT

A device, system and method of playing back a digital audio stream wherein large amounts of pre-emphasis of the high frequencies is applied before the digital to analog conversion and before an interpolation or digital filter, followed by de-emphasis in the analog domain in order to yield better audio fidelity.

27 Claims, 7 Drawing Sheets

METHOD, SYSTEM AND APPARATUS FOR IMPROVING THE SONIC QUALITY OF AN AUDIO SIGNAL

RELATED APPLICATIONS

This patent application claims priority under 35 U.S.C. 119(e) to the U.S. Provisional Patent Application Ser. No. 61/473,923, filed Apr. 11, 2011, and entitled "A METHOD FOR IMPROVING THE SONIC QUALITY OF A DIGITAL AUDIO SIGNAL," which is hereby incorporated by reference.

FIELD OF THE INVENTION

The present invention relates to analog signal conversion. Specifically, the present invention relates to the analog conversion of digital audio data streams such as: CD players, Audio Digital to Analog converters, MP3 players, Cell Phones.

BACKGROUND OF THE INVENTION

Perhaps the largest visible change in the history of audio is the replacement of Long Playing Records (LPs) to their successor the Compact Disk (CDs). LPs are considered "Analog" recordings where the stored acoustic signals of the recordings are physical disturbances to a smooth spiral pressed into vinyl. CDs store the recordings as digital values that vary in time. The CD is a standard where the encoded values have 16-bit resolution and are recorded at a rate of 44.1 kHz. There were obvious advantages to the CD, but for many of the highest performing audio systems, the LP has yet to be surpassed by the CD in terms of fidelity of the playback.

There are two reasons for the lack of fidelity of CDs: Digital audio recordings have a distortion profile where the distortion is lowest for the loudest signals, whereas analog recordings have exactly the opposite behavior, the distortion increases with signal amplitude. Much of music is relatively low level with occasional loud signals. Hence, digital audio recording sounds best when the music is loud and analog recordings sound best when the music is quiet.

The second reason why Analog Audio can sound better than Digital Audio is due to the "Pink" nature of music. Specifically, as shown in FIG. 14, a spectrum analysis of typical music illustrates that the high frequency spectrum is much lower in amplitude than the low frequencies. In other words, the high frequencies are always very quiet. Typically, the amplitude is inversely proportional to the frequency. 10 KHz content is typically two orders of magnitude smaller than 100 Hz content.

CD audio is based on a 16-bit digitization, so the largest number for a quantization is 32768 (the smallest is −32768). Typically a signal has 20 dB of headroom (20 dB is a factor of 10), so 3277 is a typical quantization for a normal passage of music. If the 100 Hz content were 3277, the 10 kHz would have 2 orders of magnitude less, or 30 quantization levels (out of a maximum of 32768). This is obviously not the highest resolution.

All good recording methods previously in history have included equalization to ensure high frequency fidelity. For example, LPs used Recording Industry Association of America (RIAA) equalization, and Analog Tape used the National Association of Broadcasters (NAB) standard. The high frequencies are boosted (emphasis) prior to storage. A reverse equalization is applied during playback (de-emphasis). As Digital engineers were anxious to rid the system of precision capacitors needed to accurately apply emphasis and de-emphasis, emphasis was essentially excluded from digital recordings. There is an equalization curve defined for CD, it is 10 dB (about a factor of 3). This was used in very early recordings. This was not seen as helpful and was quickly excluded. The RIAA equalization curve had nearly 40 dB of high frequency emphasis wherein 40 dB is a factor of 100.

FIG. 1 illustrates a block diagram of a typical audio processing element 100. Specifically, as shown in FIG. 1, the audio processing element 100 comprises an interpolation component 102, a digital to analog converter 104 and an output filter 106 operably coupled to each other. The interpolation component 102 receives an input audio signal 99 from an audio source (not shown) such as the analog low amplitude 5 KHz sine wave shown in FIG. 7 after it has been converted to a digital signal including the associated quantization error as shown in FIG. 8. Such a low amplitude high frequency sine wave is a typical component in a digital music recording such as a CD recording. The interpolation component 102 then interpolates the input audio signal 99 in order to produce the interpolated audio signal 98. FIG. 9 illustrates the sine wave of FIG. 8 after a standard 8× interpolation. The quantization error is apparent in the difference between the input signal 99 and the interpolated audio signal 98. The digital to analog converter 104 then receives and converts the interpolated audio signal 98 to an analog signal 97, which is then filtered by the output filter 106 in order to produce the output audio signal 96 that is transmitted to an audio playback device (not shown).

SUMMARY OF THE INVENTION

The method, system and device described herein comprises equalizing a digital signal in the digital domain (emphasis in the high frequencies), thereby yielding much higher number of quantizations at high frequencies. Digital up-sampling is able to be applied to shift quantization noise higher in frequency. Then de-emphasis is able to occur in the analog domain with tradition equalization circuitry. This technique increases the number of quantizations for the small high frequency components, therefore yielding higher fidelity due to more accuracy in the digital-to-analog conversion process.

One aspect of the present application is directed to a method of improving the sonic quality of an audio signal. The method comprises receiving the audio signal, performing a high frequency emphasis on the audio signal producing an emphasized audio signal and converting the emphasized audio signal to analog producing an emphasized analog audio signal. In some embodiments, the method further comprises interpolating the emphasized audio signal by digitally upsampling the emphasized audio signal. In some embodiments, the method further comprises performing a high frequency de-emphasis on the emphasized analog audio signal in the analog domain producing an output audio signal. In some embodiments, the high frequency de-emphasis uses a de-emphasis curve of more than 11 dB in the analog domain. In some embodiments, the audio signal is a digital signal and the high frequency emphasis is performed in the digital domain. In some embodiments, the audio signal is an analog signal and the high frequency emphasis is performed in the analog domain. In some embodiments, the emphasized audio signal is converted to digital before the emphasized audio signal is interpolated. In some embodiments, the method further comprises performing a second high frequency emphasis on the emphasized audio signal in the digital domain. In some embodiments, the high frequency emphasis is performed using an infinite impulse response filter. In some embodiments, the high frequency emphasis is performed using a finite impulse response filter.

A second aspect of the present application is directed to an audio device for improving the sonic quality of an audio signal. The device comprises an emphasis component that inputs the audio signal and performs a high frequency emphasis on the audio signal producing an emphasized audio signal and a digital to analog converter coupled with the emphasis component, wherein the digital to analog converter converts the emphasized audio signal to analog producing an emphasized analog audio signal. In some embodiments, the device further comprises an interpolation component coupled between the emphasis component and the digital to analog converter, wherein the interpolation component interpolates the emphasized audio signal by digitally upsampling the emphasized audio signal. In some embodiments, the device further comprises a de-emphasis component coupled to the digital to analog converter, wherein the de-emphasis component performs a high frequency de-emphasis on the emphasized analog audio signal in the analog domain producing an output audio signal. In some embodiments, the high frequency de-emphasis uses a de-emphasis curve of more than 11 dB in the analog domain. In some embodiments, the audio signal is a digital signal and the high frequency emphasis is performed in the digital domain. In some embodiments, the audio signal is an analog signal and the high frequency emphasis is performed in the analog domain. In some embodiments, the device further comprises an analog to digital converter coupled with the emphasis component, wherein the analog to digital converter converts the emphasized audio signal to digital before the emphasized audio signal is interpolated. In some embodiments, the device further comprises a second high frequency emphasis component coupled with the analog to digital converter, wherein the second high frequency emphasis component performs a second high frequency emphasis on the emphasized audio signal in the digital domain. In some embodiments, the high frequency emphasis is performed using an infinite impulse response filter. In some embodiments, the high frequency emphasis is performed using a finite impulse response filter. In some embodiments, the device further comprises an audio source that stores the audio signal or inputs the audio signal from an external source. In some embodiments, the audio source is one selected from the group consisting of a microphone, a compact disc, and a non-transitory computer readable medium. In some embodiments, the device further comprises an audio playback element that receives the output audio signal and plays the audio for a user of the device.

Another aspect of the present application is directed to an audio system for improving the sonic quality of an audio signal. The system comprises an audio source that stores the audio signal or inputs the audio signal and an audio processing element coupled with the audio source, comprising an emphasis component that inputs the audio signal and performs a high frequency emphasis on the audio signal producing an emphasized audio signal and a digital to analog converter coupled with the emphasis component, wherein the digital to analog converter converts the emphasized audio signal to analog producing an emphasized analog audio signal. In some embodiments, the system further comprises an interpolation component coupled between the emphasis component and the digital to analog converter, wherein the interpolation component interpolates the emphasized audio signal by digitally upsampling the emphasized audio signal. In some embodiments, the audio processing element further comprises a de-emphasis component coupled to the digital to analog converter, wherein the de-emphasis component performs a high frequency de-emphasis on the emphasized analog audio signal in the analog domain producing an output audio signal. In some embodiments, the high frequency de-emphasis uses a de-emphasis curve of more than 11 dB in the analog domain. In some embodiments, the audio signal is a digital signal and the high frequency emphasis is performed in the digital domain. In some embodiments, the audio signal is an analog signal and the high frequency emphasis is performed in the analog domain. In some embodiments, the audio processing element further comprises an analog to digital converter coupled with the emphasis component, wherein the analog to digital converter converts the emphasized audio signal to digital before the emphasized audio signal is interpolated. In some embodiments, the audio processing element further comprises a second high frequency emphasis component coupled with the analog to digital converter, wherein the second high frequency emphasis component performs a second high frequency emphasis on the emphasized audio signal in the digital domain. In some embodiments, the high frequency emphasis is performed using an infinite impulse response filter. In some embodiments, the high frequency emphasis is performed using a finite impulse response filter. In some embodiments, the audio source is one selected from the group consisting of a microphone, a compact disc, and a non-transitory computer readable medium. In some embodiments, the system further comprises an audio playback element coupled with the audio processing element, wherein the audio playback element receives the output audio signal and plays the audio for a user of the system.

Yet another aspect of the present application is directed to a method of improving sonic quality of a digital audio signal. The method comprises receiving the digital audio signal, performing a high frequency emphasis on the audio signal in the digital domain producing a digital emphasized audio signal, interpolating the digital emphasized audio signal by digitally upsampling the digital emphasized audio signal, converting the digital emphasized audio signal to analog producing an analog emphasized audio signal and performing a high frequency de-emphasis on the analog emphasized audio signal in the analog domain producing an output audio signal. In some embodiments, the high frequency de-emphasis uses a de-emphasis curve of more than 11 dB in the analog domain.

DETAILED DESCRIPTION OF THE INVENTION

The method, system and device described herein comprises receiving an input signal and equalizing by emphasizing the high frequencies of the input signal. As a result, an interpolation of the emphasized signal is able to yield a greater number of quantizations at high frequencies. Digital up-sampling is able to be applied to the interpolated and emphasized signal to shift quantization noise higher in frequency and de-emphasis is able to occur in the analog domain. As a result, the system is able to yield higher audio signal fidelity due to the reduced quantization error and corresponding more accurate digital-to-analog conversion of the input signal.

Figure 1:
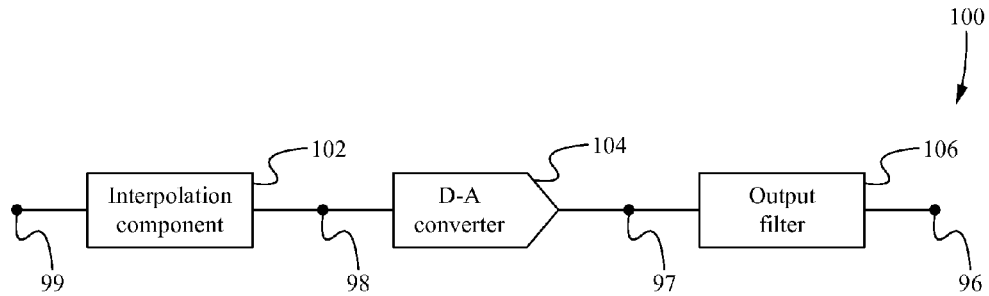
FIG. 1 illustrates a block diagram of typical audio processing element.
Figure 2:
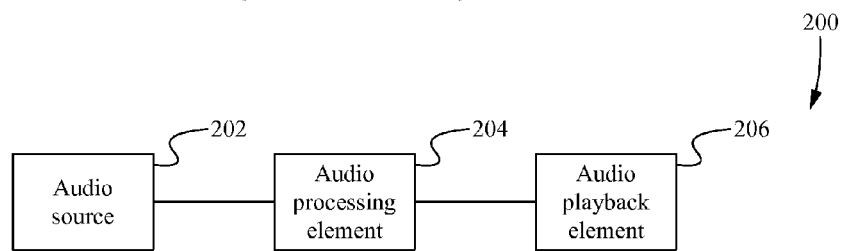
FIG. 2 illustrates an audio playback system according to some embodiments.

FIG. 2 illustrates an audio playback system 200 according to some embodiments. As shown in FIG. 2, the system 200 comprises an audio source 202, an audio processing element 204 and an audio playback element 206 all coupled together. The audio source 202 is able to be any dynamic or static source of audio signals as are well known in the art. For example, in some embodiments the audio source 202 is able to comprise a CD, tape, computer readable media or other media capable of storing audio signals. Alternatively, the audio source 202 is able to comprise a microphone or other type of audio recording device capable of receiving and transmitting audio signals. The audio processing element 204 is able to comprise a field-programmable gate array (FPGA), a digital signal processor (DSP), a computational CPU or any other type of computing device capable of processing audio signals as are well known in the art. For example, in some embodiments, the audio processing element 204 comprises a CD player, MP3 player, mobile computing device or other types of computing devices capable of processing audio signals as are well known in the art. The audio playback element 206 is able to comprise one or more devices capable of receiving an audio signal and producing audio for a listener corresponding to the signal. For example, in some embodiments, the playback element 206 comprises one or more speakers. In some embodiments, two or more of the audio source 202, audio processing element 204 and audio playback element 206 are able to be integrated into a single device. Alternatively, one or more of the audio source 202, audio processing element 204 and audio playback element 206 are able to be a part of separate devices.

Figure 3A:
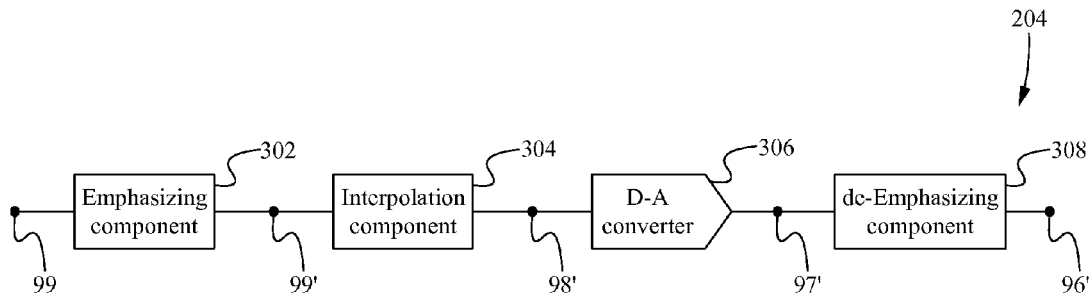
FIG. 3A illustrates the audio processing element according to some embodiments.
Figure 3B:
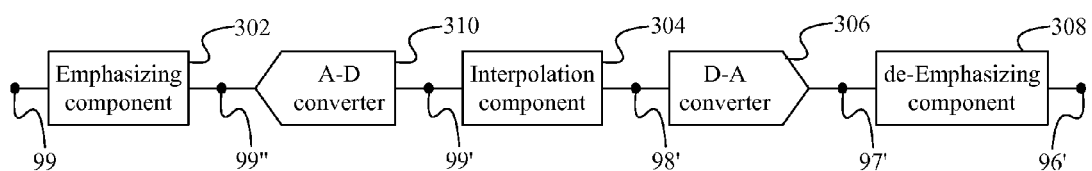
FIG. 3B illustrates the audio processing element according to some other embodiments.
Figure 8:
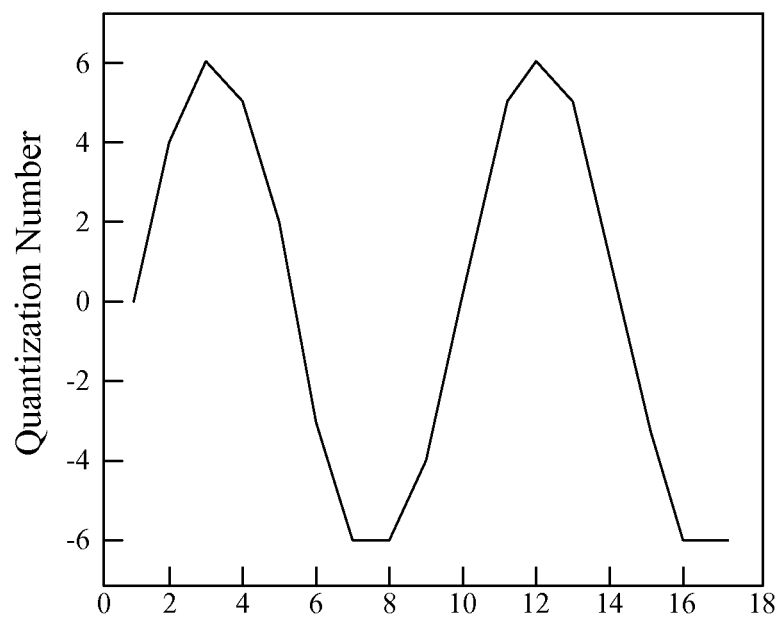
FIG. 8 illustrates a digital high frequency low amplitude 5 KHz sine wave signal component according to some embodiments.

FIGS. 3A and 3B illustrate the audio processing element 204 according to some embodiments. As shown in FIG. 3A, the audio processing element 204 comprises an emphasizing component 302 for receiving an audio input signal 99 such as the digital sine wave signal shown in FIG. 8, an interpolation component 304, a digital to analog converter 306 and a de-emphasizing component 308 each operably coupled together. In some embodiments, the emphasizing component 302 and the interpolation component 304 are able to be combined on a single FPGA or other circuit. In some embodiments, the audio input signal 99 is digital, sampled at 44.1 kHz and has a 16-bit resolution. Alternatively, the audio input signal 99 is able to be analog and/or have been sampled at any sample rate and/or have other levels of resolution. In some embodiments, the emphasizing component 302 is a digital component such that the emphasis is performed digitally and the de-emphasizing component 308 is analog such that the de-emphasis is performed in the analog domain. Alternatively, the emphasizing component 302 and/or de-emphasizing component 308 are able to be analog or digital components.

Figure 6:
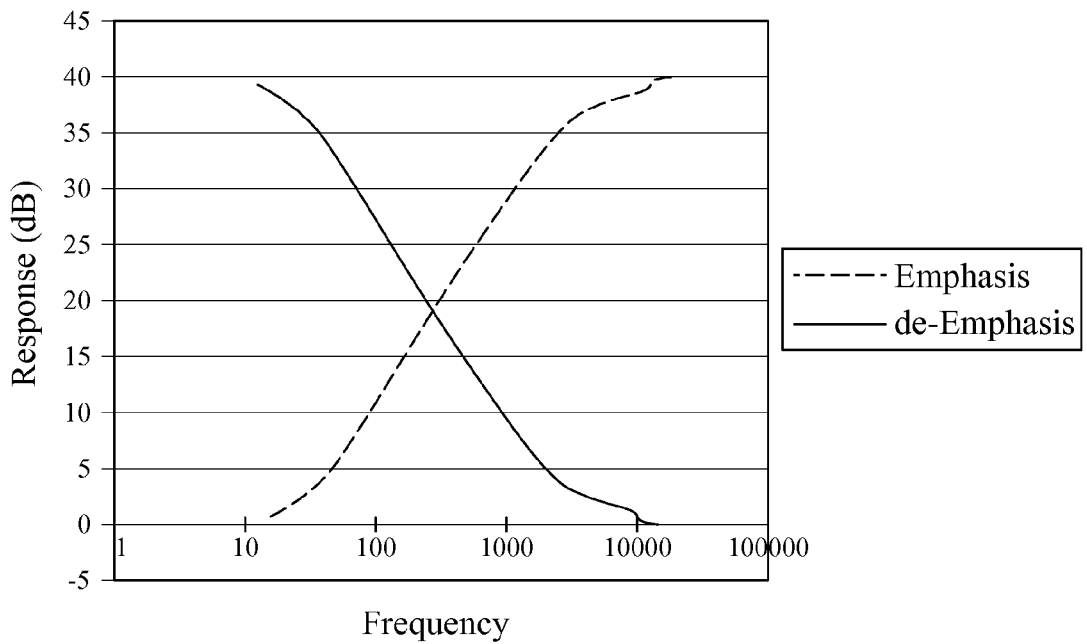
FIG. 6 illustrates the de-emphasis response compared to the emphasis response according to some embodiments.
Figure 10:
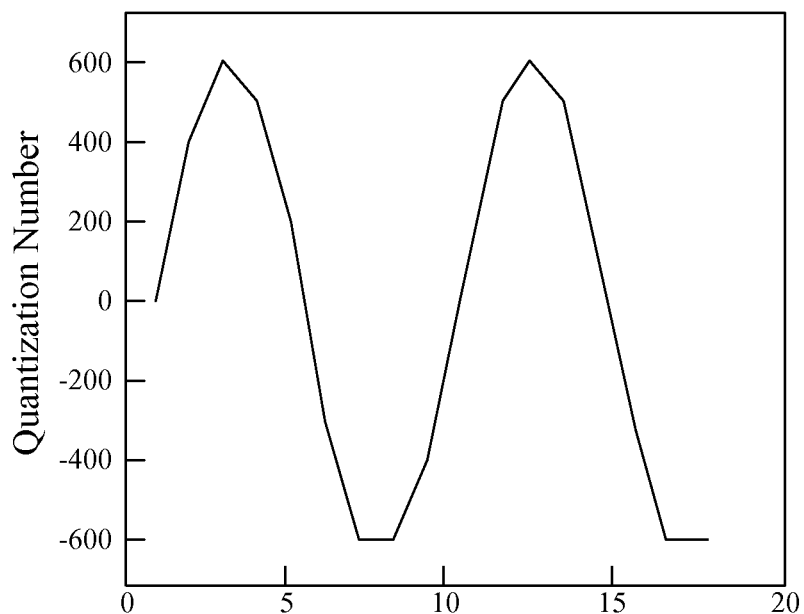
FIG. 10 illustrates emphasis with a ×100 gain applied to the digital high frequency sine wave signal component of FIG. 8 according to some embodiments.

In operation, the emphasizing component 302 receives and emphasizes the high frequencies of the input audio signal 99 in order to produce the emphasized audio signal 99'. In some embodiments, the high frequencies comprise frequencies greater than or equal to 40 Hz. Alternatively, the high frequencies are able to comprise other frequency ranges based on the received input audio signal 99. In some embodiments, the amount of emphasis applied to the signal 99 increases as frequency is increased. For example, the amount of emphasis applied is able to increase linearly between 40 Hz and 4 KHz. Alternatively, the amount of emphasis is able to be constant or the amount of emphasis is able to increase non-linearly in the high frequency range. Alternatively, the emphasis applied is able to both increase and decrease in the high frequency range as desired. FIG. 10 illustrates emphasis with a ×100 gain applied to the digital high frequency sine wave signal of FIG. 8. Specifically, the emphasis is applied to the input audio signal 99 by using an emulator of an analog circuit that boosts high frequencies. In some embodiments, the emphasizing component 302 applies an infinite impulse response (IIR) filter on the input audio signal 99 in order to emphasize the high frequencies of the input audio signal 99. Alternatively, the emphasizing component 302 is able to apply one or more filters to the input audio signal 99 selected from an infinite impulse response filter, a finite impulse response filter and other types of emphasizing filters as are well known in the art. In some embodiments, the amount of emphasis is able to be a significant amount such as 10× to 100× for high frequencies (e.g. frequencies higher than 40 or 50 Hz). In some embodiments, as shown in FIG. 6, the emphasis curve is able to be greater than 11 dB in the digital domain. In particular, FIG. 6, illustrates the emphasis response compared to the de-emphasis response according to some embodiments. Alternatively, other magnitudes of emphasis or emphasis curves are able to be applied to other ranges of high frequencies as are well known in the art. In some embodiments, the emphasis curves start in a frequency range of 50 Hz to 100 Hz and the emphasis curves end in a range of 2 KHz to 20 KHz. Alternatively, the emphasis curves are able to start and end at different frequencies as are well known in the art. As a result, the amplitude of the high frequencies of the emphasized input audio signal 99 is greater relative to the amplitude of the low frequencies before emphasis was performed. This in turn will result in decreased quantization error during the digital to analog conversion process and therefore higher signal fidelity.

Figure 4:
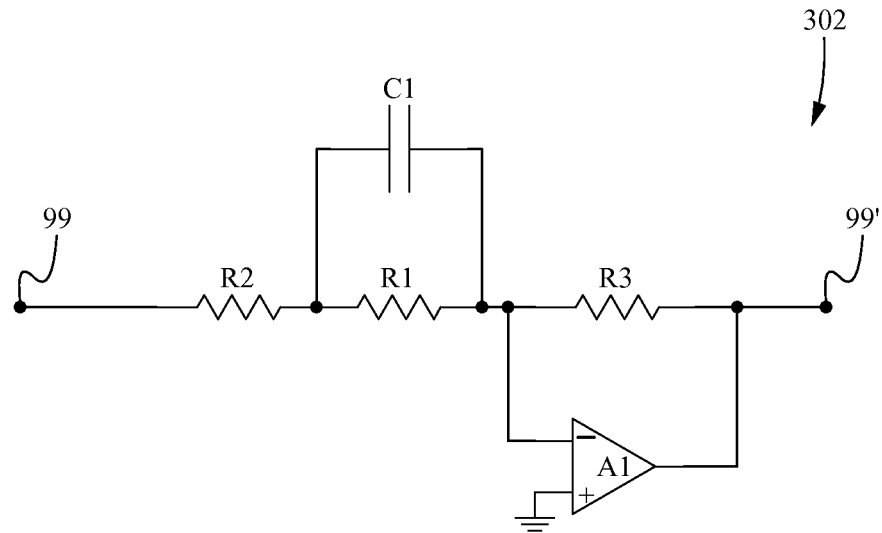
FIG. 4 illustrates a circuit diagram of the emphasis component in the analog domain according to some embodiments.

FIG. 4 illustrates a circuit diagram of the emphasis component 302 in the analog domain according to some embodiments. In particular, the circuit diagram shown in FIG. 4 is complimentary to the circuit diagram of the de-emphasis component 308 shown in FIG. 5. In some embodiments, the emphasis component 302 is implemented in the digital domain such that the digital emphasis component 302 emulates the operation of the emphasis component 302 in the analog domain as shown in FIG. 4. For example, in some embodiments the emphasis component 302 emulates the circuit diagram of FIG. 4 using the algorithm described below. Alternatively, the emphasis component 302 is able to be implemented in the digital domain such that it emulates the circuit diagram of FIG. 4 in other ways well known in the art. As shown in FIG. 4, the emphasis component 302 comprises a plurality of resistors R1, R2 and R3, a capacitor C1 and an amplifier A1. In some embodiments, the resistor R3 is 10 KOhms, the resistor R1 is 4300 Ohms, the resistor R2 is 43 Ohms and the capacitor C1 is 1 microfarad. Alternatively, the resistors and capacitor are able to comprise different values as are well known in the art. The input of the resistor R2 is electrically coupled to the input audio signal 99 received from the audio source 202 and the output of the resistor R2 is electrically coupled to the input of the capacitor C1, and the input of the resistor R1. The output of the capacitor C1 and the resistor R1 are both electrically coupled to the input of the resistor R3 and the inverting terminal of the amplifier A1. The non-inverting terminal of the amplifier A2 is coupled to ground and the output of the amplifier A2 is electrically coupled to the output of the resistor R3 and the audio playback element (not shown). As a result, the emphasis component 302 is able to input and emphasize the high frequencies of the audio signal 99 such that the high frequencies of the signal 99 are adjusted relative to the other frequencies in order to produce the emphasized digital audio signal 99'. Alternatively, the emphasis component 302 is able to comprise differently structured circuits designed to produce the desired emphasis curve as are well known in the art.

Figure 11:
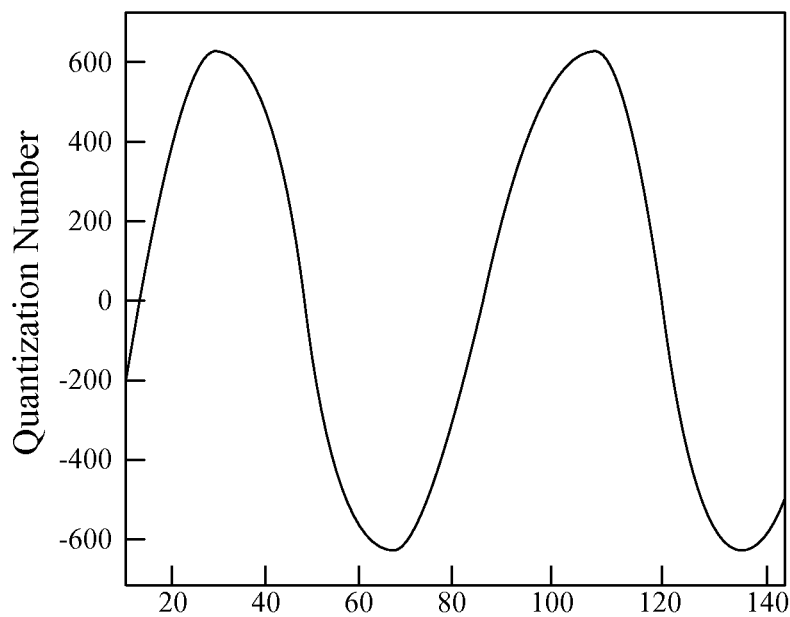
FIG. 11 illustrates the signal component of FIG. 10 after being subject to 8× interpolation according to some embodiments.

In some embodiments, the high frequency emphasis is done with the following algorithm:

The interpolation component 304 is coupled with the emphasizing component 302 such that the interpolation component 304 receives the emphasized audio signal 99' after it has been emphasized by the emphasizing component 302. As a result, the interpolation component 304 is able to interpolate or upsample the emphasized audio signal 99' using one or more interpolation techniques until a desired number of interpolated points have been determined producing an emphasized and interpolated audio signal 98'. In some embodiments 8× interpolation is performed with standard interpolation techniques and 24-bit accuracy/resolution. For example, FIG. 11 illustrates the signal of FIG. 10 after being subject to 8× interpolation. Specifically, the 8× interpolation is able to be performed by inserting 7 "zeros" between each sample and processing with a finite impulse response (FIR) filter. In particular, in some embodiments the filter coefficients used in the FIR filter are able to be: [0, −5, −9, −12, −14, −13, −11, −6, 0, 28, 53, 71, 81, 79, 64, 37, 0, −92, −180, −250, −292, −295, −250, −152, 0, 281, 596, 926, 1249, 1542, 1784, 1958, 2048, 1958, 1784, 1542, 1249, 926, 596, 281, 0, −152, −250, −295, −292, −250, −180, −92, 0, 37, 64, 79, 81, 71, 53, 28, 0, −6, −11, −13, −14, −12, −9, −5, 0]. Alternatively, the other amounts of upsampling, interpolation techniques, types of filters and/or filter coefficients are able to be used as are well known in the art. Indeed, even where only 1× interpolation is used, the emphasis of audio processing element 204 is able to greatly enhance the fidelity of the audio output signal 96'. In some embodiments, the interpolation process and interpolation component 304 is able to be omitted and/or other forms of filtering are able to be used as are well known in the art.

The digital to analog converter 306 is coupled with the interpolation component 304 such that the converter 306 receives the emphasized and interpolated audio signal 98' after it has been interpolated. The converter 306 is able to convert the received emphasized and interpolated audio signal 98' to an emphasized analog signal 97' using one or more

```
for x=1:infinity                                            //x is the sample number
    Vdiv = (signal(x) * R2) / (R1 + R2);                    //maximum voltage change
    Iin(x) = (signal(x) − Vc(x))/R1;                        //the input current
    Ir2(x) = Vc(x)/R2;                                      //the current through R2
    deltaVc(x) = ((Iin(x) − Ir2(x)) * deltaT)/C;            //voltage change of the capacitor
    if(deltaVc(x) >= 0){                                    //if delta Vc > 0
            if ((Vc(x) + deltaVc(x)) > Vdiv){               //checks for too much slew rate
Vc(1,(x+1)) = Vdiv;
        }
            else{
    Vc(x+1) = Vc(x) + deltaVc(x);                           //increments Vc
        }
    }
    if(deltaVc(x)<0){                                       // if signal is negative
        if (Vc(x) + deltaVc(x)) < Vdiv){                    //checks for too much slew rate
            out(1,(x+1)) = Vdiv;
        }
            else{
                Vc(x+1) = Vc(x) + deltaVc(x);               //increments Vc
            }
        }
    }
}
```

Where R1=0.00686 ohms, R2=0.686 ohms, C=0.0058 farads for ×100 emphasis; Signal(x)=the Digital Signal varying over time; Vc(x)=the capacitor voltage varying over time; Vc(x−1) is initialized to 0 for x=0; Ir2(x)=the current that flows in R2 over time; DeltaT=1/Sample Rate deltaVc=change in capacitor voltage per sample; and Vdiv(x) sets the maximum change for deltaVc. Alternatively, other algorithms are able to be used to perform the high frequency emphasis.

conversion techniques as are well known in the art. In some embodiments, the digital to analog converter 306 comprises integrated circuits that have 24-bit resolution. Alternatively, the integrated circuits of the converter 306 are able to have other resolutions and/or are capable of handling ×8 or ×4 over-sampling rates. In any case, because the high frequencies of the signal 98' are still amplified (from the emphasis performed in the digital domain), there is essentially no quantization error produced by the digital to analog conversion process of the analog processing element 204.

Figure 9:
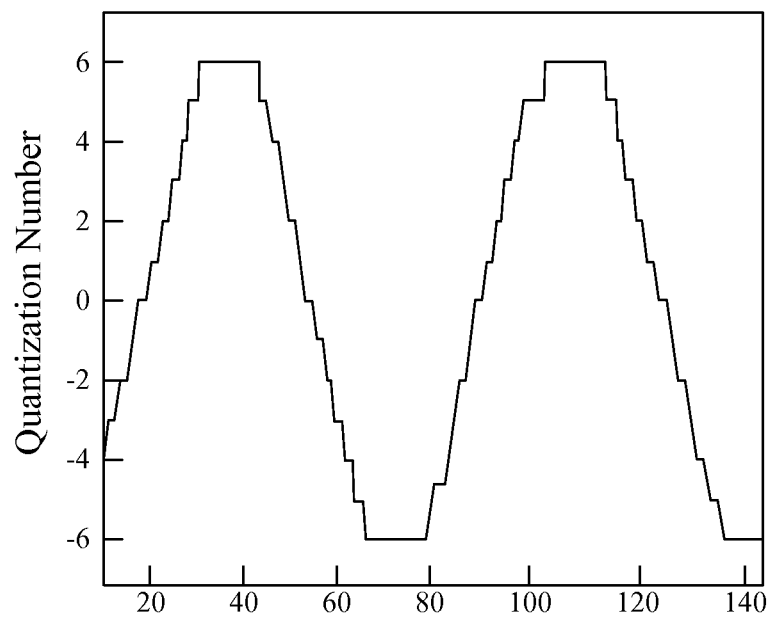
FIG. 9 illustrates the sine wave signal component of FIG. 8 after a standard 8× interpolation according to some embodiments.
Figure 12:
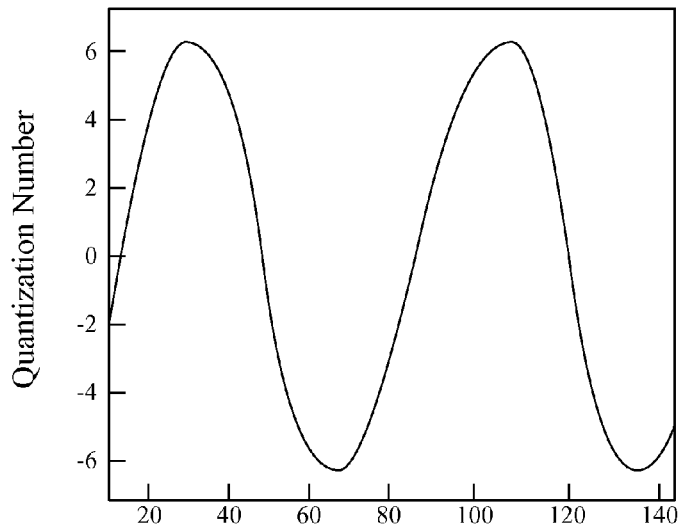
FIG. 12 illustrates the emphasized and interpolated analog audio signal component of FIG. 11 after it has been subjected to corresponding analog high frequency de-emphasis according to some embodiments.

The de-emphasis component 308 is coupled with the output of the converter 306 in order to receive and de-emphasize the high frequencies of the resulting emphasized and interpolated analog audio signal 97' in the analog domain. Specifically, this de-emphasis in the analog domain reverses the emphasis applied to the signal 99 by the emphasis component 302 in the digital domain in order to produce the high fidelity output signal 96'. Indeed, this de-emphasis in the analog domain is key to increasing the fidelity of the signal. For example, FIG. 12 illustrates the emphasized and interpolated analog audio signal of FIG. 11 after it has been subjected to corresponding analog high frequency de-emphasis. Comparing the signal of FIG. 12 to the signal of FIG. 9, it is clear that the audio processing element 204 described herein greatly improves audio signal fidelity.

Figure 5:
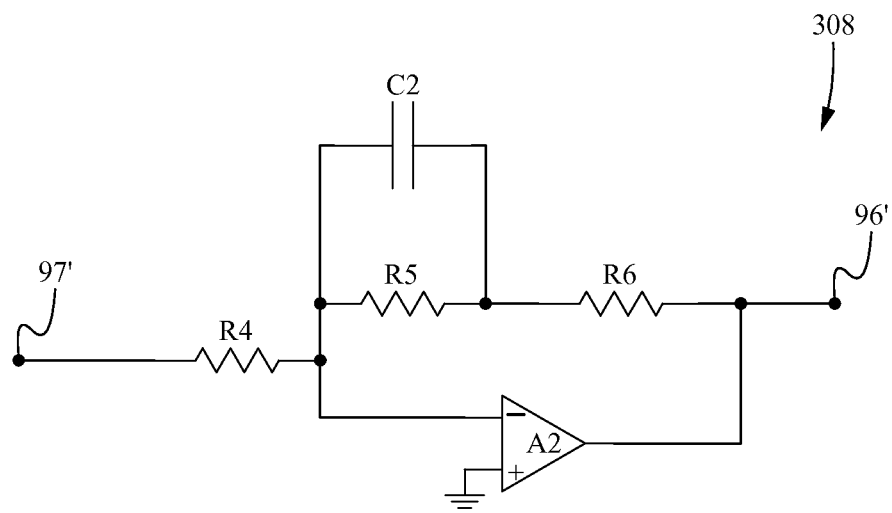
FIG. 5 illustrates a circuit diagram of the de-emphasis component in the analog domain according to some embodiments.

FIG. 6 illustrates the de-emphasis response compared to the emphasis response according to some embodiments. In particular, in some embodiments, the de-emphasis curve is greater than 11 dB in the analog domain. Alternatively, the de-emphasis curve is able to have other types of profiles that correspond to the emphasis curve such that the audio processing element 204 has an overall flat frequency response. As a result, the audio processing element 204 as a whole yields a flat frequency response relative to the input. In some embodiments, the high frequency de-emphasis is done in the analog domain using a circuit comprising one or more amplifiers, resistors and capacitors. FIG. 5 illustrates a circuit diagram of the de-emphasis component 308 in the analog domain according to some embodiments. In particular, the circuit diagram shown in FIG. 5 is complimentary to the circuit diagram of the emphasis component 302 shown in FIG. 4. As shown in FIG. 5, the de-emphasis component 308 comprises a plurality of resistors R4, R5 and R6, a capacitor C2 and an amplifier A2. In some embodiments, the resistor R4 is 10 KOhms, the resistor R5 is 4300 Ohms, the resistor R6 is 43 Ohms and the capacitor C2 is 1 microfarad. Alternatively, the resistors and capacitor are able to comprise different values as are well known in the art. The input of the resistor R4 is electrically coupled to the emphasized and interpolated analog signal 97' output by the digital to analog converter 306 and the output of the resistor R4 is electrically coupled to the input of the capacitor C2, the input of the resistor R5 and the inverting terminal of the amplifier A2. The output of the capacitor C2 and the resistor R5 are both electrically coupled to the input of the resistor R6. The non-inverting terminal of the amplifier A2 is coupled to ground and the output of the amplifier A2 is coupled to the output of the resistor R6 and the audio playback element (not shown). As a result, the de-emphasis component 308 is able to input and normalize the emphasized analog audio signal 97' such that the high frequencies of the signal 97' are normalized relative to the other frequencies in order to produce the high fidelity output audio signal 96'. Alternatively, the de-emphasis component 308 is able to comprises differently structured circuits designed to produce the desired de-emphasis curve as are well known in the art.

Figure 7:
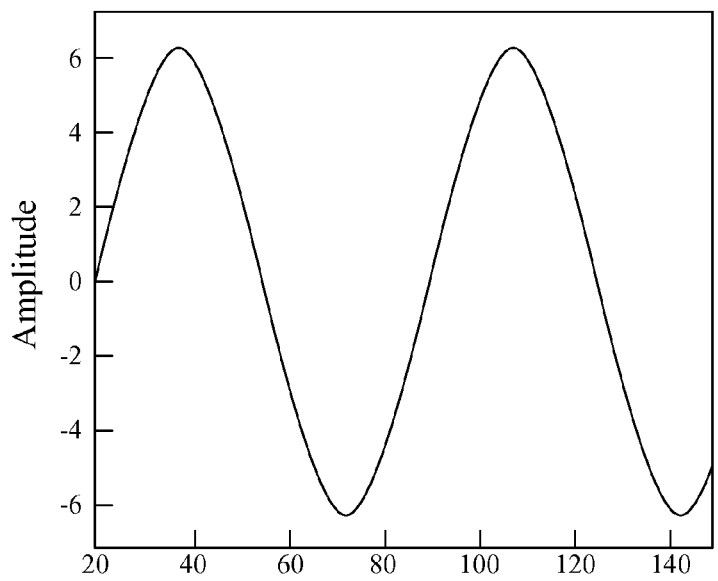
FIG. 7 illustrates an analog high frequency low amplitude 5 KHz sine wave signal component according to some embodiments.

FIG. 3B illustrates an alternate embodiment of the audio processing element 204 wherein the input audio signal 99 is an analog signal such as the high frequency 5 KHz sin wave signal component shown in FIG. 7. The processing element 204 of FIG. 3B is substantially similar to the processing element 204 of FIG. 3A except for the differences described herein. As shown in FIG. 3B, the audio processing element 204 of FIG. 3B further comprises an analog to digital converter 310 operably coupled between the emphasizing component 302 and the interpolation component 304. As a result, the emphasizing component 302 performs the high frequency emphasis on the analog input audio signal 99 in the analog domain and outputs the emphasized analog audio signal 99''' to the analog to digital converter 310. The analog to digital converter 310 converts the received emphasized analog audio signal 99''' to an emphasized digital audio signal 99'. In particular, because the signal 99 was emphasized in the analog domain, it will also be emphasized in the digital domain after the conversion to a digital signal. After conversion to digital, the signal 99' is able to be processed by the interpolation component 304, the digital to analog converter 306 and the de-emphasizing component 308 as described with reference to FIG. 3A in order to produce the high fidelity output audio signal 96'. Alternatively as described above, the interpolation process and the interpolation component 304 are able to be omitted and/or replaced by other filtering components as are well known in the art. Accordingly, the processing element 204 is able to be configured to handle either or both digital and analog audio input signals 99. Additionally, in some embodiments, the audio processing element 204 of FIG. 3B comprises a second emphasizing component (not shown) operably coupled between the analog to digital converter 310 and the interpolation component 304 such that the second emphasizing component is able to further emphasizes the high frequencies of the emphasized digital audio signal 99' output by the converter 310 in the digital domain. In such embodiments, the de-emphasizing component 308 is able to correspond to both emphasis components such that it is configured to normalize the twice emphasized analog audio signal 97'.

Figure 13:
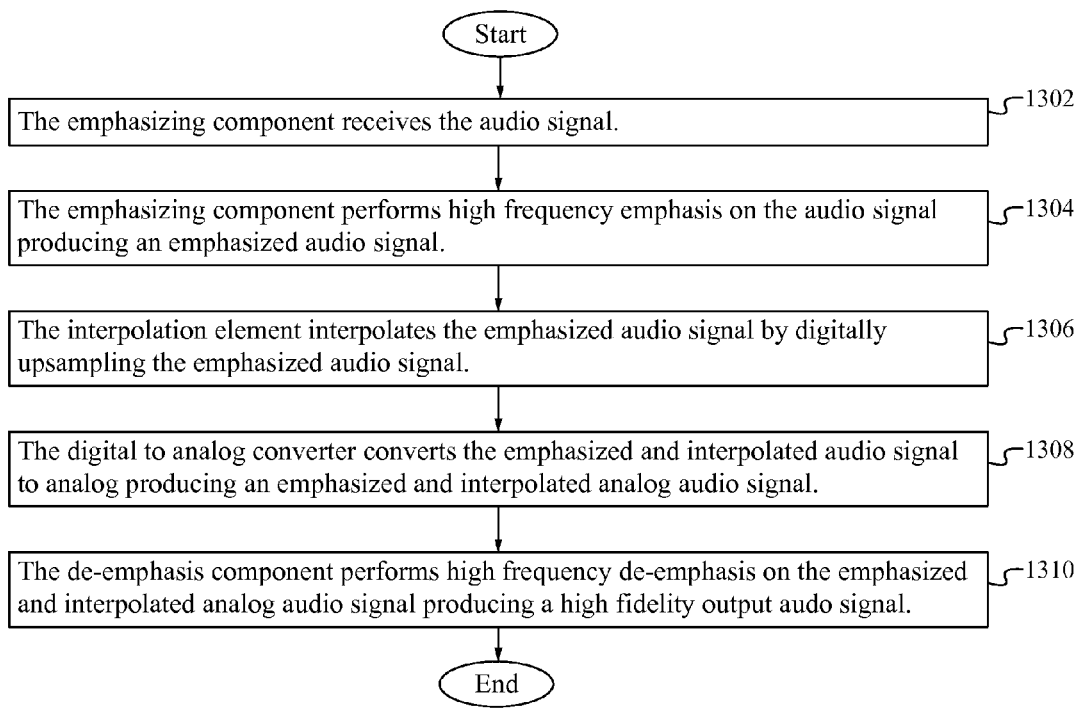
FIG. 13 illustrates a method of improving the sonic quality of an audio signal according to some embodiments.
Figure 14:
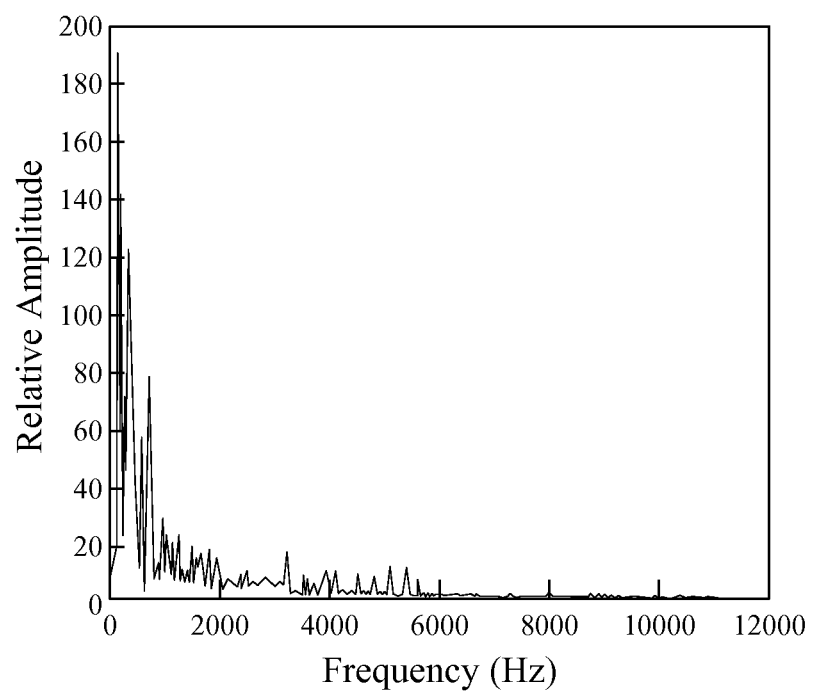
FIG. 14 illustrates a spectrum analysis of typical music audio signals.

FIG. 13 illustrates a method of improving the sonic quality of an audio signal according to some embodiments. The emphasizing component 302 receives the audio signal 99 at the step 1302. The emphasizing component 302 performs high frequency emphasis on the audio signal 99 producing an emphasized audio signal 99' at the step 1304. The interpolation element 304 interpolates the emphasized audio signal 99' by digitally upsampling the emphasized audio signal 99' at the step 1306. Alternatively, step 1306 is able to be omitted and/or the interpolation process and interpolation component 304 is able to be replaced by other types of filtering. The digital to analog converter 306 converts the emphasized and interpolated audio signal 98' to analog producing an emphasized and interpolated analog audio signal 97' at the step 1308. The de-emphasis component 308 performs high frequency de-emphasis on the emphasized and interpolated analog audio signal 97' producing a high fidelity output audio signal 96' at the step 1310. As a result, the method is able to utilize emphasis to minimize quantization error and produce a high fidelity output audio signal. In some embodiments, the high frequency de-emphasis uses a de-emphasis curve of more than 11 dB in the analog domain. In some embodiments, the audio signal 99 is a digital signal and the high frequency emphasis is performed in the digital domain. In some embodiments, the audio signal 99 is an analog signal and the high frequency emphasis is performed in the analog domain. In some embodiments, the emphasized audio signal 99' is analog and is converted to digital before the emphasized audio signal 99' is interpolated. In some embodiments, the method further comprises performing a second high frequency emphasis on the emphasized audio signal 99' in the digital domain. In some embodiments, the high frequency emphasis is performed using an infinite impulse response filter. Alternatively, the high frequency emphasis is performed using a finite impulse response filter.

The method, system and device described herein has numerous advantages. Specifically, by utilizing high frequency emphasis in the digital domain, the device is able to minimize quantization error and produce a high fidelity audio signal. In particular, an interpolation of the emphasized signal is able to yield a greater number of quantizations at high frequencies. Digital up-sampling is able to be applied to the interpolated and emphasized signal to shift quantization noise higher in frequency and de-emphasis is able to occur in the analog domain. As a result, the system is able to yield higher audio signal fidelity due to the reduced quantization error and corresponding more accurate digital-to-analog conversion of the input signal.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications can be made in the embodiment chosen for illustration without departing from the spirit and scope of the invention as defined by the claims.

What is claimed is:

1. A method of improving sonic quality of an audio signal comprising:
   a. receiving the audio signal;
   b. performing a high frequency emphasis on the audio signal producing an emphasized audio signal;
   c. interpolating the emphasized audio signal by digitally upsampling the emphasized audio signal;
   d. converting the emphasized audio signal to analog producing an emphasized analog audio signal; and
   e. performing a high frequency de-emphasis on the emphasized analog audio signal in the analog domain producing an output audio signal, wherein the de-emphasis is configured to reverse the high frequency emphasis applied to the audio signal, wherein the high frequency de-emphasis uses a de-emphasis curve of more than 11 dB in the analog domain.

2. The method of claim 1, wherein the audio signal is a digital signal and the high frequency emphasis is performed in the digital domain.

3. The method of claim 1, wherein the audio signal is an analog signal and the high frequency emphasis is performed in the analog domain.

4. The method of claim 3, wherein the emphasized audio signal is converted to digital before the emphasized audio signal is interpolated.

5. The method of claim 4, further comprising performing a second high frequency emphasis on the emphasized audio signal in the digital domain.

6. The method of claim 1, wherein the high frequency emphasis is performed using an infinite impulse response filter.

7. The method of claim 1, wherein the high frequency emphasis is performed using a finite impulse response filter.

8. An audio device for improving sonic quality of an audio signal, the device comprising:
   a. an emphasis component that inputs the audio signal and performs a high frequency emphasis on the audio signal producing an emphasized audio signal;
   b. a digital to analog converter coupled with the emphasis component, wherein the digital to analog converter converts the emphasized audio signal to analog producing an emphasized analog audio signal; and
   c. a de-emphasis component coupled to the digital to analog converter, wherein the de-emphasis component performs a high frequency de-emphasis on the emphasized analog audio signal in the analog domain producing an output audio signal, wherein the de-emphasis is configured to reverse the high frequency emphasis applied to the audio signal, wherein the high frequency de-emphasis uses a de-emphasis curve of more than 11 dB in the analog domain; and
   d. an interpolation component coupled between the emphasis component and the digital to analog converter, wherein the interpolation component interpolates the emphasized audio signal by digitally upsampling the emphasized audio signal.

9. The device of claim 8, wherein the audio signal is a digital signal and the high frequency emphasis is performed in the digital domain.

10. The device of claim 8, wherein the audio signal is an analog signal and the high frequency emphasis is performed in the analog domain.

11. The device of claim 10, further comprising an analog to digital converter coupled with the emphasis component, wherein the analog to digital converter converts the emphasized audio signal to digital before the emphasized audio signal is interpolated.

12. The device of claim 11, further comprising a second high frequency emphasis component coupled with the analog to digital converter, wherein the second high frequency emphasis component performs a second high frequency emphasis on the emphasized audio signal in the digital domain.

13. The device of claim 8, wherein the high frequency emphasis is performed using an infinite impulse response filter.

14. The device of claim 8, wherein the high frequency emphasis is performed using a finite impulse response filter.

15. The device of claim 8, further comprising an audio source that stores the audio signal or inputs the audio signal from an external source.

16. The device of claim 15, wherein the audio source is one selected from the group consisting of a microphone, a compact disc, and a non-transitory computer readable medium.

17. The device of claim 8, further comprising an audio playback element that receives the output audio signal and plays the audio for a user of the device.

18. An audio system for improving sonic quality of an audio signal, the system comprising:
   a. an audio source that stores the audio signal or inputs the audio signal; and
   b. an audio processing element coupled with the audio source, comprising:
      i. an emphasis component that inputs the audio signal and performs a high frequency emphasis on the audio signal producing an emphasized audio signal;
      ii. a digital to analog converter coupled with the emphasis component, wherein the digital to analog converter converts the emphasized audio signal to analog producing an emphasized analog audio signal; and
      iii. a de-emphasis component coupled to the digital to analog converter, wherein the de-emphasis component performs a high frequency de-emphasis on the emphasized analog audio signal in the analog domain producing an output audio signal, wherein the de-emphasis is configured to reverse the high frequency emphasis applied to the audio signal, wherein the high frequency de-emphasis uses a de-emphasis curve of more than 11 dB in the analog domain; and
      iv. an interpolation component coupled between the emphasis component and the digital to analog converter, wherein the interpolation component interpolates the emphasized audio signal by digitally upsampling the emphasized audio signal.

19. The system of claim 18, wherein the audio signal is a digital signal and the high frequency emphasis is performed in the digital domain.

20. The system of claim 18, wherein the audio signal is an analog signal and the high frequency emphasis is performed in the analog domain.

21. The system of claim 20, wherein the audio processing element further comprises an analog to digital converter coupled with the emphasis component, wherein the analog to digital converter converts the emphasized audio signal to digital before the emphasized audio signal is interpolated.

22. The system of claim 21, wherein the audio processing element further comprises a second high frequency emphasis component coupled with the analog to digital converter, wherein the second high frequency emphasis component performs a second high frequency emphasis on the emphasized audio signal in the digital domain.

23. The system of claim 18, wherein the high frequency emphasis is performed using an infinite impulse response filter.

24. The system of claim 18, wherein the high frequency emphasis is performed using a finite impulse response filter.

25. The system of claim 24, wherein the audio source is one selected from the group consisting of a microphone, a compact disc, and a non-transitory computer readable medium.

26. The system of claim 18, further comprising an audio playback element coupled with the audio processing element, wherein the audio playback element receives the output audio signal and plays the audio for a user of the system.

27. A method of improving sonic quality of a digital audio signal comprising:
   a. receiving the digital audio signal;
   b. performing a high frequency emphasis on the audio signal in the digital domain producing a digital emphasized audio signal;
   c. interpolating the digital emphasized audio signal by digitally upsampling the digital emphasized audio signal;
   d. converting the digital emphasized audio signal to analog producing an analog emphasized audio signal; and
   e. performing a high frequency de-emphasis on the analog emphasized audio signal in the analog domain producing an output audio signal, wherein the de-emphasis is configured to reverse the high frequency emphasis applied to the audio signal, wherein the high frequency de-emphasis uses a de-emphasis curve of more than 11 dB in the analog domain.

* * * * *